United States Patent [19]

Yahagi et al.

[11] Patent Number: 5,247,301

[45] Date of Patent: Sep. 21, 1993

[54] ANALOG-TO-DIGITAL CONVERSION METHOD AND APPARATUS WITH A CONTROLLED SWITCH FOR HIGH-SPEED CONVERSION

[75] Inventors: Kouichi Yahagi; Masumi Kasahara, both of Takasaki, Japan

[73] Assignee: Hitachi, Ltd., Tokyo, Japan

[21] Appl. No.: 761,262

[22] Filed: Sep. 17, 1991

[30] Foreign Application Priority Data

Sep. 20, 1990 [JP] Japan ................................. 2-251399

[51] Int. Cl.$^5$ ......................... H03M 1/14; H03K 1/00
[52] U.S. Cl. .................................. 341/156; 341/122; 341/118; 307/451; 307/576; 307/353
[58] Field of Search ............... 341/118, 122, 155, 156, 341/158, 159; 307/572, 573, 574, 575, 576, 577, 578, 579, 491, 352, 353, 443, 451

[56] References Cited

U.S. PATENT DOCUMENTS

| 3,697,978 | 10/1972 | Prill | 341/122 |
| 4,612,531 | 9/1986 | Dingwall et al. | 341/156 |
| 4,745,393 | 5/1988 | Tsukada et al. | 341/156 |
| 5,075,688 | 12/1991 | Hosotani et al. | 341/122 |

FOREIGN PATENT DOCUMENTS

| 61-65623 | 4/1986 | Japan | 307/576 |
| 63-96800 | 4/1988 | Japan | 307/353 |
| 63-157522 | 6/1988 | Japan | . |
| 2-41028 | 2/1990 | Japan | 341/155 |
| 2-67817 | 3/1990 | Japan | 307/572 |

OTHER PUBLICATIONS

N. Fukushima, et al., "A CMOS 40MHz 8b 105mW Two-Step ADC", ISCC 89/Wed., Feb. 15, 1989, pp. 14–15.
T. Matsuura, et al., "An 8-b 50 MHz 225-mW Submicron CMOS ADC Using Saturation Eliminated Comparators", IEEE 1990 Custom Integrated Circuits Conference, pp. 6.4.1–6.4.4.

Primary Examiner—Howard L. Williams
Attorney, Agent, or Firm—Fay, Sharpe, Beall, Fagan, Minnich & McKee

[57] ABSTRACT

An analog-to-digital converter receiving an analog signal and producing a digital output signal corresponding to a value of the analog signal includes a plurality of sets each having a plurality of sample-and-hold circuits having inputs connected in parallel with each other, an analog switch responsive to a control signal to apply the input analog signal to the junction of the parallel connection of the plurality of sample-and-hold circuits, and a plurality of encoders respectively connected to outputs of the plurality of sets to convert output signals of the plurality of sample-and-hold circuits into a binary signal. Each of the plurality of sample-and-hold circuits includes a series connection of a second analog switch and a capacitor and the analog-to-digital converter further includes comparators connected to outputs of the plurality of sample-and-hold circuits. Advantageously, errors in timing for sampling conducted in the plurality of sample-and-hold circuits can be eliminated.

48 Claims, 6 Drawing Sheets

COMPENSATION FOR CHANGE INJECTION
- ● WITH COMPENSATOR
- ○ WITHOUT COMPENSATOR

ANALOG-TO-DIGITAL CONVERSION METHOD AND APPARATUS WITH A CONTROLLED SWITCH FOR HIGH-SPEED CONVERSION

BACKGROUND OF THE INVENTION

The present invention relates to analog-to-digital (AD) converters and more particularly to techniques for fabrication of multi-step AD converters and analog switches which are formed on MIS type or MOS type semiconductor integrated circuit devices, especially, the technique used for converting a high-speed analog signal such as a video signal into a digital signal in, for example, digital televisions, video cassette recorders and video tape recorders.

Two-step CMOS AD converters are disclosed in JP-A-63-157522, "A CMOS 40 MHz 8 b 105 mW Two-Step ADC" by N. Fukushima et al, ISSCC 89/WEDNESDAY, FEB. 15, 1989/WEST GRAND BALLROOM, pp. 14–15, "An 8-b 50-MHz 225-mW SUBMICRON CMOS ADC USING SATURATION ELIMINATED COMPARATORS" by T. Matsuura et al. IEEE 1990 CUSTOM INTEGRATED CIRCUITS CONFERENCE, pp. 6.4.1.–6.4.4.

A presupposition required for correct conversion to be performed in the two-step or sub-flash ADC is that an analog signal to be converted into upper bit data is the same as an analog signal to be converted into a lower bit data. In other words, an analog signal to be sampled and held for comparison by means of upper sample-and-hold circuits must be the same as an analog signal to be sampling and held for comparison by means of lower sample-and-hold circuits.

Practically, however, the timing for an analog signal to be sampled by the upper sample-and-hold circuits cannot perfectly coincide with the timing for the analog signal to be sampled by the lower sample-and-hold circuits because of a difference in edge shift between sampling clocks due to unevenness in transfer characteristics and circuit constants. Therefore, there is a very slight difference between the timings for sampling by the upper sample-and-hold circuits and lower sample-and-hold circuits and even within this time difference, the analog signal such as a video signal whose level changes at a very high rate will change greatly in its level. Consequently, the level of the analog signal sampled and held for comparison by the upper sample-and-hold circuits and lower sample-and-hold circuits is different for the two types of sample-and-hold circuits and hence continuity between the upper bit data and lower bit data cannot be ensured, resulting in conversion errors.

SUMMARY OF THE INVENTION

An object of the invention is to provide a technique of performing highly precisely at a high speed the AD conversion to be effected by using the mutually separated upper bit data and lower bit data.

Another object of the invention is to provide a two-step AD converter (ADC) in which an input signal for AD conversion of the upper bit data coincides with an input signal for AD conversion of the lower bit data.

Still another object of the invention is to provide an analog signal sampling circuit capable of permitting high-speed operation of the multi-step ADC.

Still another object of the invention is to provide a video signal processing apparatus which can realize high-speed and highly precise AD conversion.

Still another object of the invention is to provide a compensator incorporated into a MIS sub-flash AD converter and operable to compensate for signal offset so as to realize high-speed and highly precise AD conversion.

According to the invention, an analog signal is applied to a plurality of AD converters to be processed into upper bit data and lower bit data so as to effect AD conversion of the analog signal by using the mutually separated upper bit data and lower bit data, and the application of the analog signal to the plurality of AD converters is collectively controlled by means of a common analog switch.

With the above construction, the AD conversion input for the upper bit data can accurately coincide with the AD conversion input for the lower bit data.

A cascade connection of transistors which is connected to the common analog switch can decrease or compensate for offset of the input signal.

DESCRIPTION OF THE PREFERRED EMBODIMENTS

Figure 1:
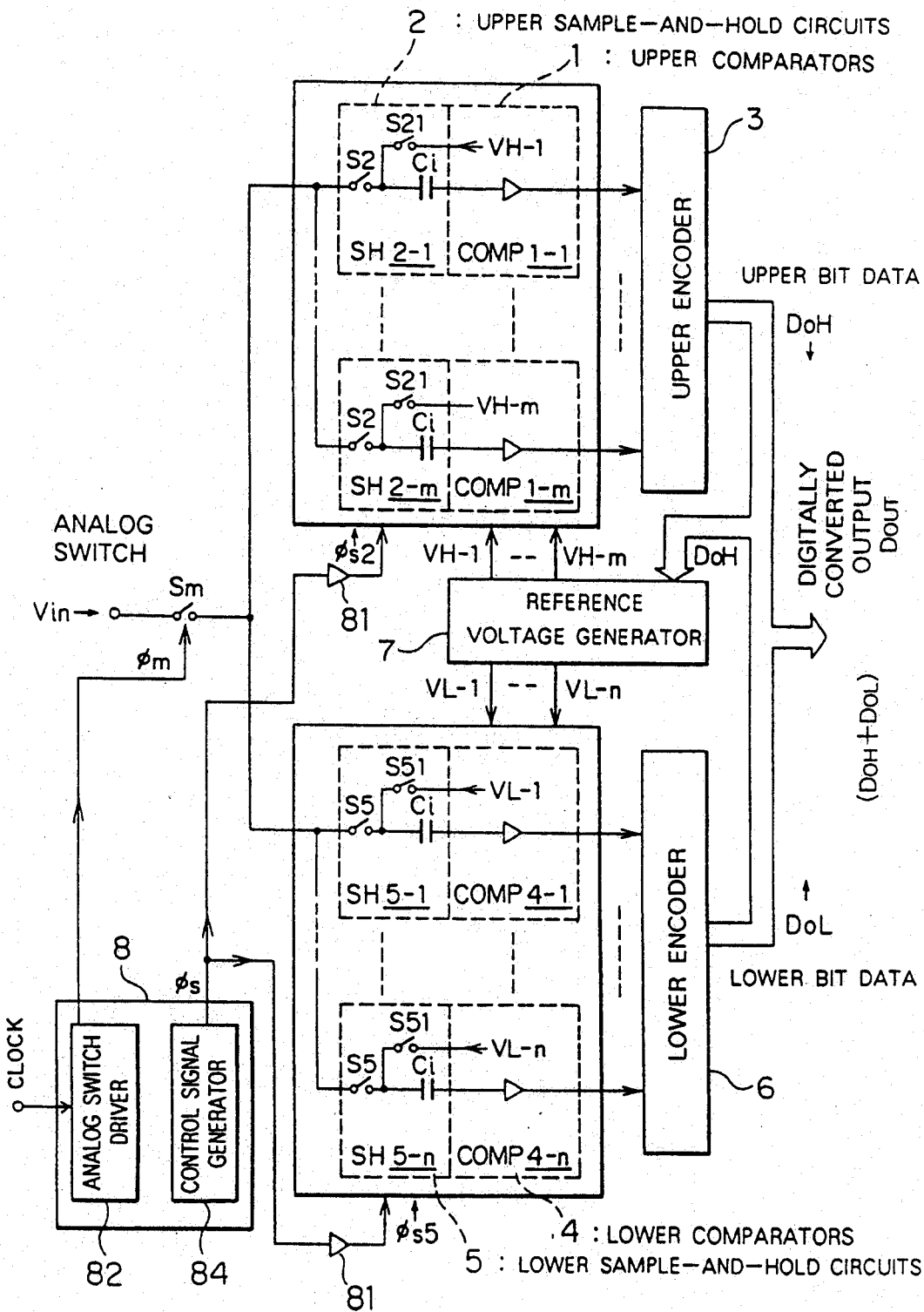
FIG. 1 is a circuit diagram showing an embodiment of an AD converter to which the technique of the invention is applied.

In the accompanying drawings, identical reference characters designate identical or like parts.

FIG. 1 shows an embodiment of an AD converter to which the technique characteristic of the present invention is applied. The circuit of the FIG. 1 converter may be formed on a semiconductor substrate of, for example, silicon signal crystal by using the known CMOS fabrication technique.

The AD converter shown in FIG. 1 is a two-step AD converter receiving an input analog signal Vin. The two-step AD converter comprises upper comparators 1-1 to 1-m, ganged into an upper comparator set designated by reference numeral 1, for comparing reference voltages VH-1 to VH-m corresponding to upper bit data DoH with the analog signal Vin in parallel, upper sample-and-hold circuits 2-1 to 2-m ganged into a set designated by reference numeral 2 and provided in association with the individual comparators to sample and hold, in respect to each comparator, the analog signal Vin applied for comparison to the comparators 1, an upper encoder 3 for encoding results of comparison at the upper comparators 1 into binary codes and holding the binary codes temporarily, lower comparators 4-1 to 4-n, ganged into a lower comparator set designated by reference numeral 4, for comparing reference voltages VL1 to VLn corresponding to lower bit data DoL with the analog signal Vin in parallel, lower sample-and-hold circuits 5-1 to 5-n ganged into a set designated by reference numeral 5 and provided in association with the individual comparators to sample and hold, in respect of each comparator, the analog signal Vin applied for comparison to the comparators 4, a lower encoder 6 for encoding results of comparison at the lower comparators 4 into binary codes, a reference voltage generator 7 for generating the reference voltages VH-1 to VH-m of upper comparators 1 and the reference voltages VL-1 to VL-n of lower comparators 4, an analog switch Sm, provided in common to the upper and lower sample-and-hold circuits 2 and 5, for collectively switching and controlling the analog signal Vin, about to branch and proceed to the upper and lower sample-and-hold circuits 2 and 5, in advance of the branching, and a control signal generator 8 for generating sampling clocks $\phi s2$ and $\phi s5$ of the sample-and-hold circuits 2 and 5 and a control clock $\phi m$ of the common analog switch Sm. On the basis of the output results of the upper comparators, the generator 7 sets the lower reference voltages for the two-step operation of sub-flash AD converter. Denoted by 81 are buffer circuits. By operating the upper comparators 1 and lower comparators 4 sequentially, a digitally converted output Dout measuring DoH+DoL corresponding to the analog signal Vin can be obtained from the upper encoder 3 and lower encoder 6.

Each of the upper sample-and-hold circuits 2-1 to 2-m includes a capacitor Ci of fixed capacitance, a switch S2 for applying the analog signal Vin to the capacitor Ci and a switch S21 for applying each of the reference voltages VH-1 to VH-m to the capacitor Ci. Similarly, each of the lower sample-and-hold circuits 5-1 to 5-n includes a capacitor Ci of fixed capacitance, a switch S5 for applying the analog signal Vin to the capacitor Ci and a switch S51 for applying each of the reference voltages VL-1 to Vl-n to the capacitor Ci. The switches S2 each constructed of MOS transistors are sequentially turned on by the sampling clock $\phi s2$ from the control signal generator 8 complementarily with turn-on of the switches S21 each constructed of MOS transistors and similarly the switches S5 each constructed of MOS transistors are sequentially turned on by the sampling clock $\phi s5$ from the control signal generator 8 complementarily with turn-on of the switches S51 each constructed of MOS transistors, so that the individual capacitors Ci are charged with the input analog signal Vin and discharged at the reference voltages VH-1 to VH-m or the reference voltages VL-1 to VL-n.

The capacitor Ci thus charged with the input analog signal Vin and discharged at the reference voltages VH-1 to VH-m or VL-1 to VL-n provides a residual potential polarity which in turn is compared with one of the reference voltages by each of the comparators 1-1 to 1-m or 4-1 to 4-n, producing a comparison output of binary logic which is "1" or "0".

On the basis of the results of comparison at the upper comparators 1, the reference voltage generator 7 performs the second step of setting the reference voltages VL-1 to VL-n of lower comparators 4 which are finer than the reference voltages VH-1 to VH-m.

The common analog switch Sm can be provided by connecting a p-channel MOS transistor and an n-channel MOS transistor in parallel as will be described later with reference to FIG. 3. The analog switch Sm responds to the control clock $\phi m$ from the control signal generator 8 to collectively switch and control the analog signal Vin, about to branch and proceed to the upper and lower sample-and-hold circuits 2 and 5.

The control signal generator 8 is so constructed as to generate, in addition to the sampling clocks $\phi s2$ and $\phi s5$ and control clock $\phi m$ described previously, a control signal not shown for sequence control of the upper comparators 1, lower comparators 4, upper encoder 3 and lower encoder 6.

Figure 2:
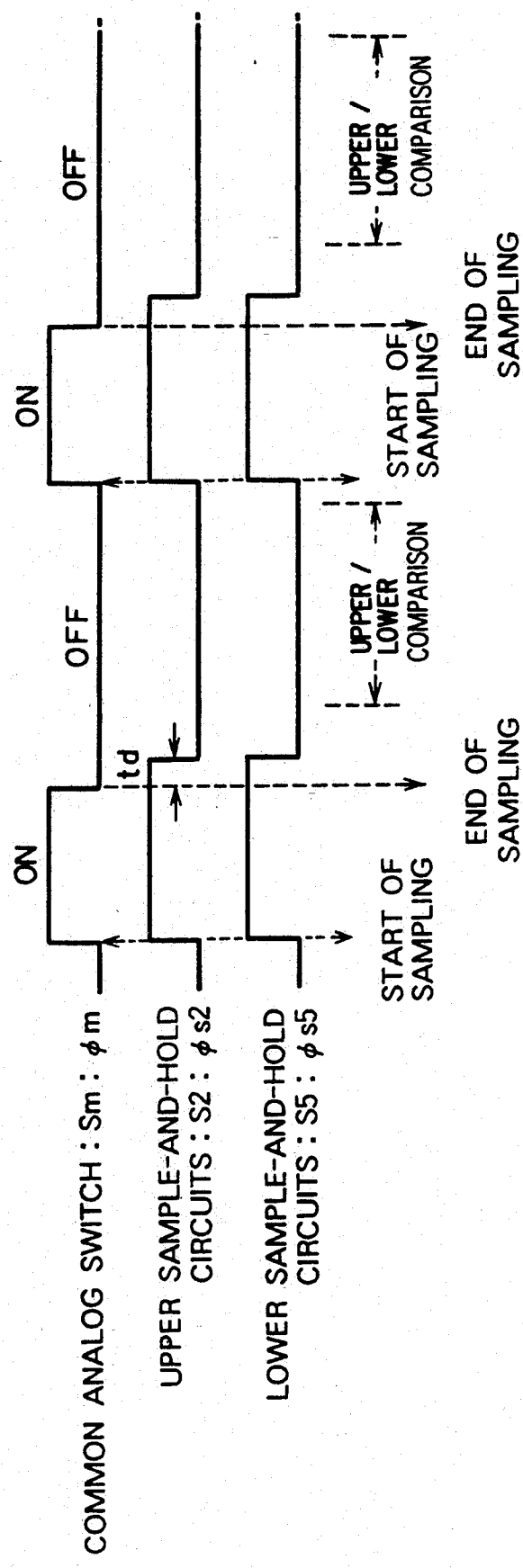
FIG. 2 is a timing chart shorting an example of operation of the essential part of the AD converter shown in FIG. 1.

FIG. 2 is a timing chart showing the operation of the essential part of the previously-described AD converter.

Firstly, when the sampling clocks $\phi s2$ and $\phi s5$ and control clock $\phi m$ are enabled as shown in FIG. 2 in the control signal generator shown in FIG. 1, the sampling switches S2 in the sample-and-hold circuits 2, the sampling switches S5 in the sample-and-hold circuits 5 and the common analog switch Sm are turned on, so that the capacitors Ci in the sample-and-hold circuits 2 and 5 are charged with a value corresponding to the level (voltage) of the analog signal Vin.

Subsequently, when the output control clock $\phi m$ of an analog switch driver 82 is disabled, the common analog switch Sm is turned off to simultaneously disconnect the capacitors Ci is the sample-and-hold circuits 2 and 5 from the analog signal Vin. Then, the output sampling clocks $\phi s2$ and $\phi s5$ of a delay circuit 84 are disabled with a slight delay (td) from the turn-off of the common analog switch Sm, thereby turning off the switches S2 and S5 for sampling in the sample-and-hold circuits 2 and 5.

Consequently, even if there is a slight difference in edge shift between the sampling clock $\phi s2$ for upper sample-and-hold circuits 2 and the sampling clock $\phi s5$ for lower sample-and-hold circuits 5, the capacitors Ci in the sample-and-hold circuits 2 and 5 can be charged substantially equally with a level (voltage) of analog signal Vin appearing at the time point that the common analog switch Sm was changed from on-state to off-state.

In this manner, the upper and lower comparators 1 and 4 can handle comparison of such a level of analog signal Vin as deemed to be sampled at substantially the same timing at which $\phi m$ is disabled. Thus, the AD conversion input for the upper bit data DoH and the AD conversion input for the lower bit data DoL can be applied at substantially the same timing.

As described above, the AD conversion to be effected by using the mutually separated upper bit data DoH and lower bit data DoL can be carried out highly precisely at a high speed while preserving continuity between the upper bit and the lower bit.

The switch Sm is connected in parallel with m switches S2 and n switches S5. Since on-resistance Rm of this switch Sm is connected in series with on-resistance Rs2 of each switch S2 or on-resistance Rs5 of each switch S5, the on-resistance Rm should preferably be small in order to ensure high-speed operation of the AD converter circuit and consequently it is preferable that parameters of channel dimension of MOS transistors constructing the analog switches be so selected as to satisfy $Rm < 10Rs2$ and $Rm < 10Rs5$. Accordingly, for the sake of effectively suppressing the size of the analog switch-circuit as a whole, it is preferable that these analog switches be related to each other in the ratio W/L between channel width W and channel length L of the MOS transistors as follows:

$$\frac{Wm}{Lm} > 10 \frac{Ws2}{Ls2},$$

$$\frac{Wm}{Lm} > 10 \frac{Ws5}{Ls5},$$

where Wm and Lm represent channel width and channel length of P- or N-channel MOS transistors of the analog switch Sm, Ws2 and Ls2 represent channel width and channel length of P- or N-channel MOS transistors of each upper analog switch S2, and Ws5 and Ls5 represent channel width and channel length of P- or N-channel MOS transistors of each lower analog switch S5.

Figure 3:
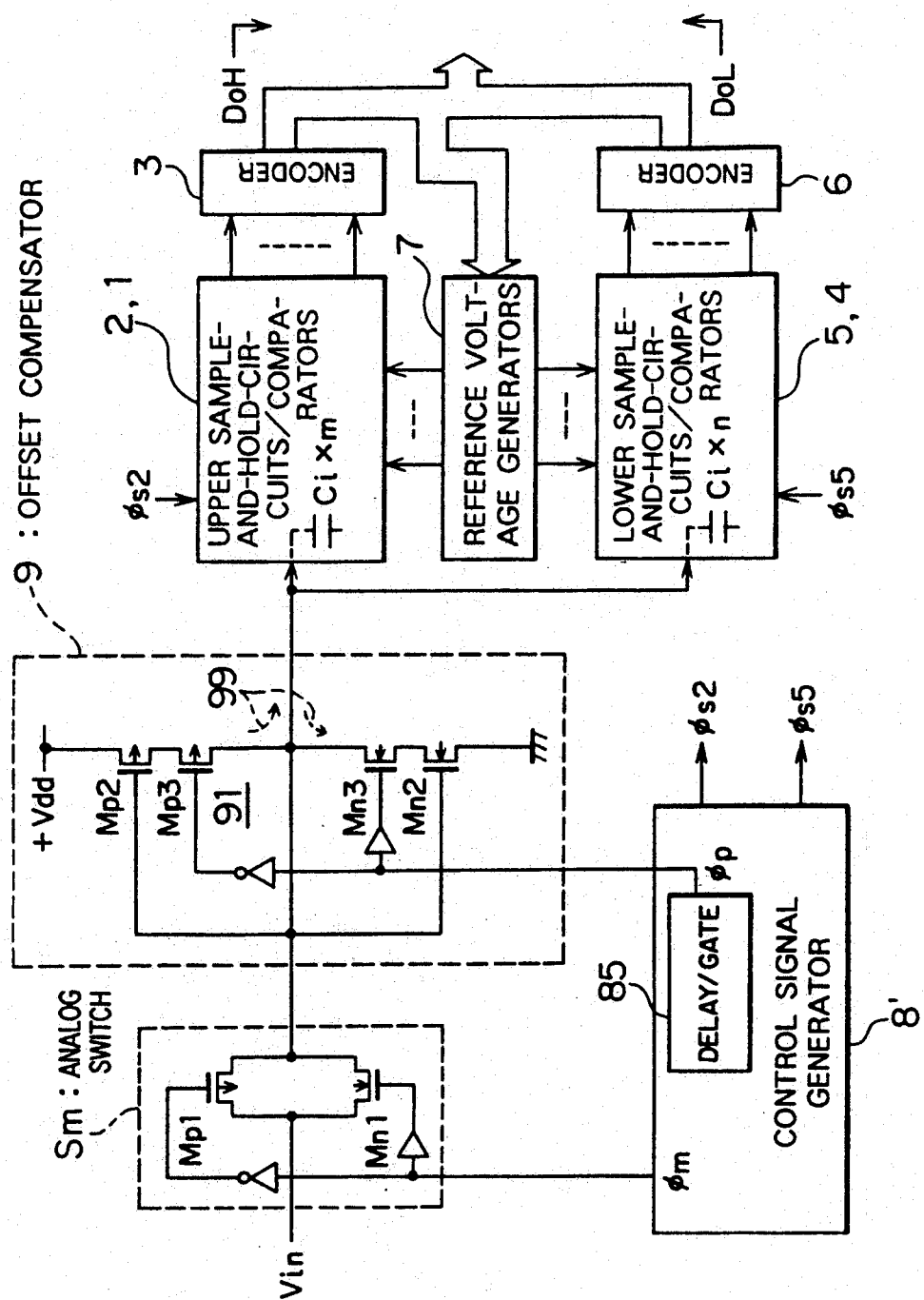
FIG. 3 is a circuit diagram showing another embodiment of the AD converter according to the invention.

FIG. 3 shows another embodiment of the AD converter of the invention.

This embodiment differs from the foregoing embodiment in that in addition to the previously-described construction, there is provided an offset compensator 9 which compensates for voltage offset due to inter-electrode capacitance of MOS transistors Mp1 and Mn1 forming the analog switch Sm. The compensator 9 includes a clocked CMOS inverter 91 having its input and output terminals connected to the output of the analog switch Sm.

Figure 4:
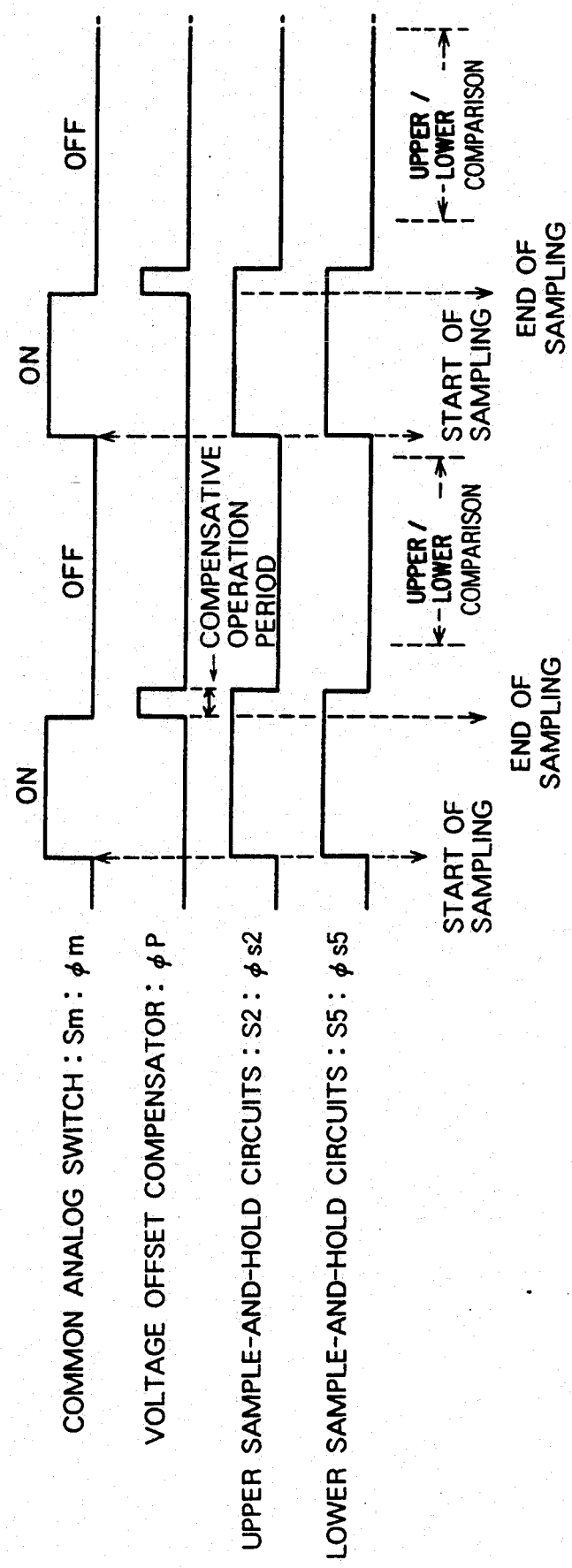
FIG. 4 is a timing chart showing an example of operation of the essential part of the AD converter shown in FIG. 3.

As shown in FIG. 4, the clocked CMOS inverter 91 is disabled during normal operation (excepting the compensation period) so as not to interfere with the output of the analog switch Sm but immediately after the analog switch Sm changes from on-state to off-state, it responds to a trigger pulse $\phi p$ from a control signal generator 8' to be enabled momentarily. The trigger pulse $\phi p$ can be prepared by means of a combined delay and gate circuit 85 which utilizes the fall edge of the control clock $\phi m$ used to turn on/off the analog switch Sm.

In the clocked CMOS inverter 91, negative feedback operation due to the input and output terminals connected in common acts momentarily, with the result that electric charge is injected in a direction of dotted arrow 99 in FIG. 3 to cancel out electric charge transiently injected into the inverter 91 through inter-electrode capacitance between the gate and source/drain regions of the MOS transistors Mp1 and Mn1 constituting the analog switch circuit Sm.

Figure 5:
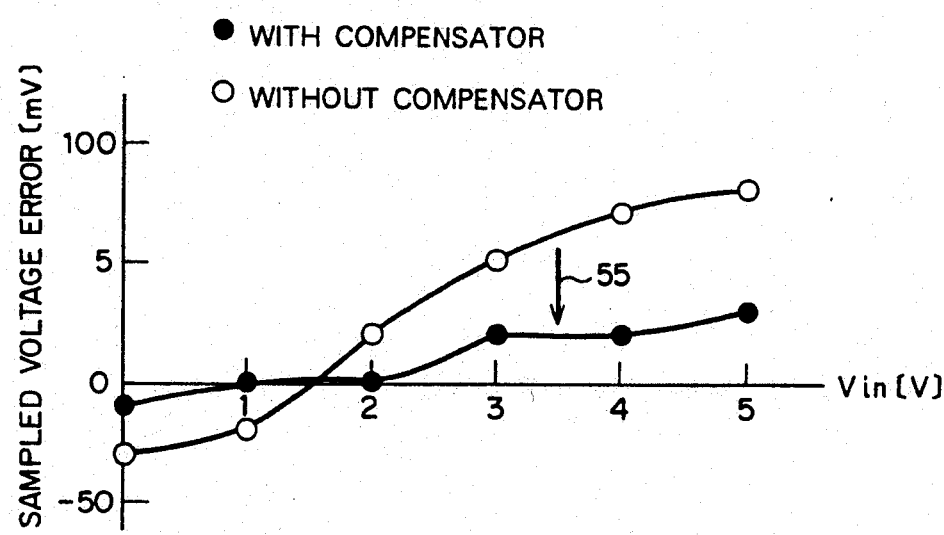
FIG. 5 is a graph exemplifying the effect of a voltage offset compensator according to the invention.

Accordingly, as shown at arrow 55 in FIG. 5, for example, by selecting a suitable value of the width (duty) of the trigger pulse $\phi p$, voltage offset due to the common analog switch Sm can be compensated for.

In this case, CMOS transistors Mp2, Mp3, Mn2 and Mn3 constituting the clocked CMOS inverter 91 are merely required to cancel out a small amount of electric charge transiently injected through a small inter-electrode capacitance between the gate and source/drain regions and therefore their occupation area can be far smaller than that of the MOS transistors Mp1 and Mn1 of the analog switch Sm undergoing compensation. In FIG. 4, in comparison with the on-duration of $\phi m$, $\phi s2$ and $\phi s5$ being about several of tens of ns, the on-duration of $\phi p$ is sufficiently short, amounting to about several ns.

The compensator 9 applied to the AD converter as described above may also be applied to, for example, a switched capacitor in which a great number of analog switches each formed of MOS transistors are used.

The invention achieved by the present inventors has been described specifically by referring to the embodiments but obviously the present invention is not limited thereto and can be changed and modified in various ways without departing from the scope of gist of the invention.

For example, the transistors constituting the common analog switch Sm may be MIS (metal insulator semiconductor) transistors other than the MOS transistors.

Figure 6:
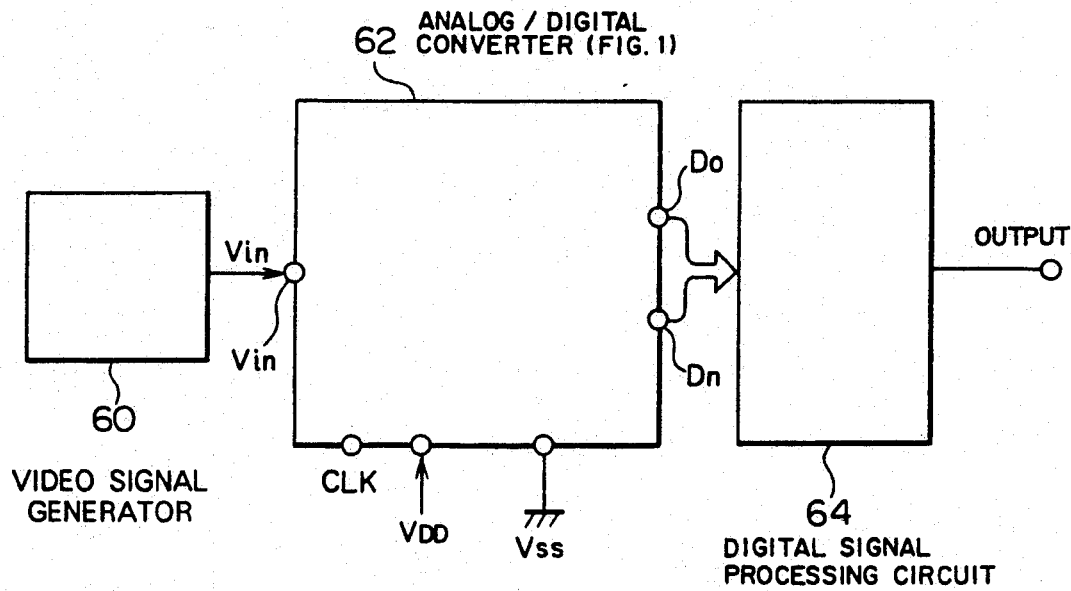
FIG. 6 is a circuit diagram showing an example of construction of a video signal processing apparatus according to the invention.

FIG. 6 shows an apparatus according to another embodiment of the invention wherein a video signal undergoes signal processing through analog-to-digital conversion.

A video signal received from a video signal generator 60 is applied, together with a clock, to an integrated-circuited AD converter 62 to provide digital output signals Do to Dn. A digital signal processing circuit 64 delivers a signal representative of a result of processing.

Circles ○ seen in FIG. 6 are used to indicate external terminals Vin (input terminal), Vss (terminal supplied with the ground level of the circuit), Vcc (terminal supplied with the power source level of the circuit), CLK (terminal applied with an external system clock) and Do to Dn (terminals of providing output data). Analog-to-digital circuits described in conjunction with the drawings of FIGS. 1, 3 and 7 also have external terminals in the same way.

In the foregoing description, the present invention has been described as being applied principally to the sub-flash AD converter which is the utilization field backgrounding the present invention but the invention is in no way limited thereto and may also be applied to a pipelined AD converter in which a plurality of set of flash AD converters are operated in parallel.

Figure 7:
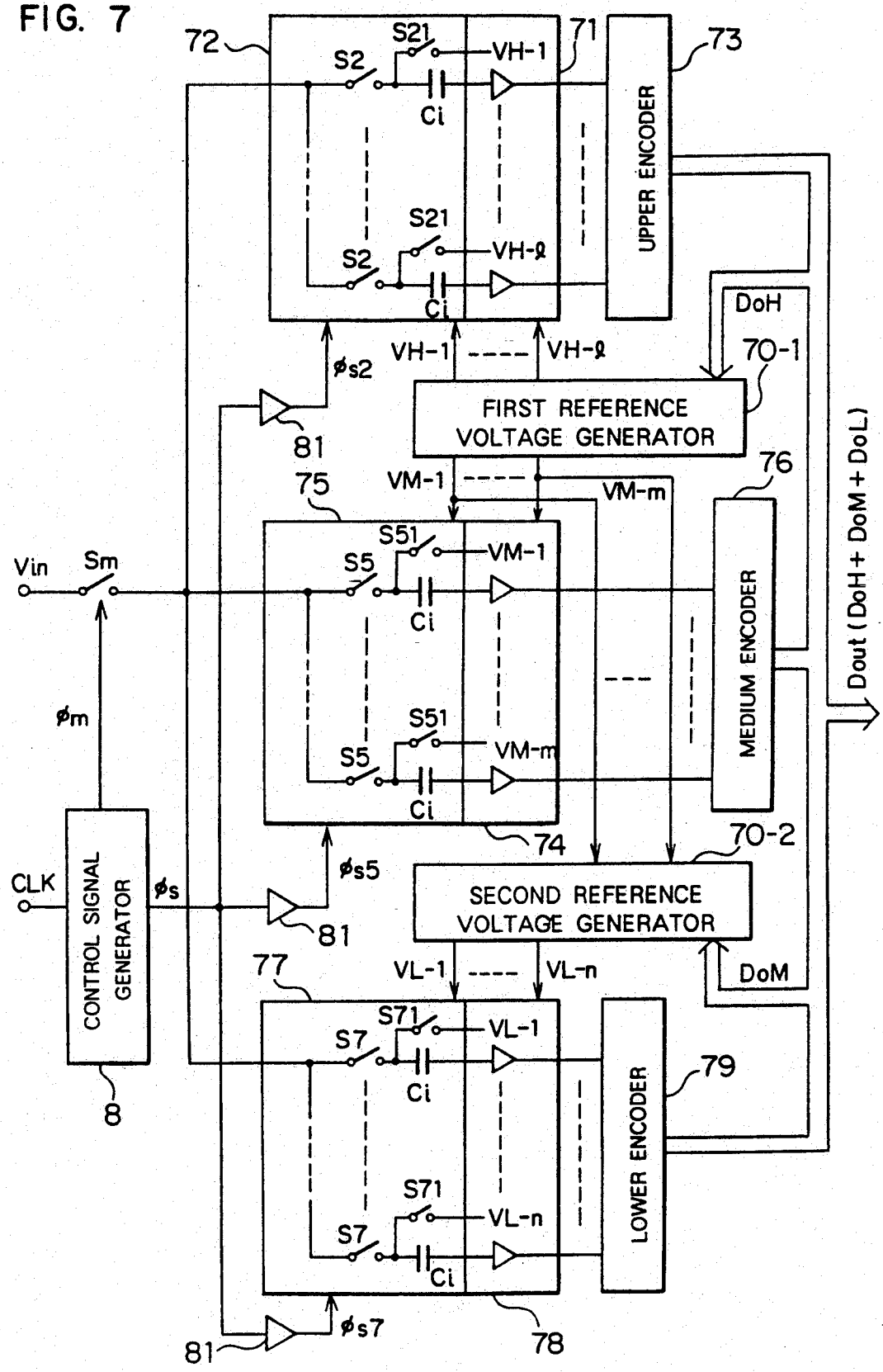
FIG. 7 is a circuit diagram showing a still another embodiment of the subflash AD converter according to the invention.

FIG. 7 shows the construction of a three-stage subflash AD converter by using like reference characters, some of which are prefixed with 7, to designate components like those in the FIG. 1 embodiment. Outputs of upper, medium and lower encoders 73, 76 and 79 are combined together to form a digital output Dout. A plurality of medium reference voltages VM-1 to VM-m applied to a plurality of medium sample-and-hold circuits, ganged into a set designated by reference numeral 75, are also applied to a second reference voltage generator 70-2 so as to be used for setting a plurality of lower reference voltages on the basis of a medium digital output DoM. It will be appreciated that the internal construction and function of the other components such as control signal generator 8, analog Sm and buffers 81 resembles that of the FIG. 1 embodiment.

The three-stage pipelined AD converter has the above construction and an AD converter of four or more stages can be constructed in accordance with the teachings of the above construction.

In any of the embodiments of FIGS. 1 and 7, the buffers 81 may be omitted.

We claim:

1. An analog-to digital converter for receiving an analog input signal and producing a digital output signal corresponding to a value of the analog input signal, the converter comprising:

a plurality of circuit sets each having a plurality of comparator means for comparing a reference voltage to an analog signal, each of the plurality of comparator means comprising:
  i) a sample-and-hold circuit, all of the sample-and-hold circuits having: inputs connected in parallel with each other at a junction for sampling and holding said analog input signal and a series connection of a capacitor and a first switch connected to said junction, and;

ii) a second switch connected to said series connection between said first switch and said capacitor for applying said reference voltage to each of said capacitors;

analog switch means for selectively applying said analog input signal to said junction, said analog switch means comprising a MOS transistor switch means;

a plurality of encoder means, each respectively connected to a one of said plurality of circuit sets for converting output signals of said plurality of comparator means into said digital output signal; and compensator means for compensating means for an offset voltage at the junction due to said analog switch.

2. The analog-to-digital converter according to claim 1 further comprising control means for applying clock signals to said analog switch means, the plurality of first switches and said compensator means.

3. The analog-to-digital converter according to claim 2, wherein said control means includes:

first clock means for generating a first clock signal for a first predetermined period and applying the first clock signal to said analog switch and second clock means for generating a second clock signal for a second predetermined period longer than said first predetermined period, and applying the second clock signal to the plurality of first switches, and;

third clock means for generating a third clock signal for a third predetermined period following expiration of said first predetermined period and applying the third clock signal to said compensator means; and, wherein said compensator means comprises a plurality of MOS transistors connected in series with each other to form a clocked inverter connected between said analog switch means and said junction of the parallel connection of said plurality of sample-and-hold circuits, said clocked inverter having an input and an output connected to each other.

4. The analog-to-digital converter according to claim 3 further comprising a reference voltage generator means for receiving part of said digital output signal outputted by at least one of said plurality of encoders and applying a plurality of reference voltages to said plurality of comparator means in accordance with said digital output signal.

5. The analog-to-digital converter according to claim 4 wherein said MOS transistor switch means includes a P-channel MOS transistor and an N-channel MOS transistor each having a drain-source path coupled to said junction of said parallel connection of said plurality of sample-and-hold circuits for applying said analog input signal to said junction.

6. The analog-to-digital converter according to claim 5 wherein mutually opposite polarity signals based on said third clock signal are applied to gates of said P-channel MOS transistor and said N-channel MOS transistor.

7. The analog-to-digital converter according to claim 5 wherein said plurality of reference voltages generated by said reference voltage generator are applied to said second switches of said plurality of comparator means of each of said plurality of circuit sets.

8. The analog-to-digital converter according to claim 4 wherein said MOS transistor switch means includes a serial connection of a first P-channel MOS transistor having a gate terminal connected to said junction, a second P-channel MOS transistor having a gate terminal receiving a first polarity signal based on said third clock signal, a first N-channel MOS transistor having a gate terminal receiving a second polarity signal mutually opposite said first polarity signal based on said third clock signal, and a second N-channel MOS transistor having a gate terminal connected to said junction.

9. The analog-to-digital converter according to claim 3 wherein said MOS transistor switch means includes a serial connection of a first P-channel MOS transistor having a gate terminal connected to said junction, a second P-channel MOS transistor having a gate terminal receiving a first polarity signal based on said third clock signal, a first N-channel MOS transistor having a gate terminal receiving a second polarity signal mutually opposite said first polarity signal based on said third clock signal, and a second N-channel MOS transistor having a gate terminal connected to said junction.

10. The analog-to-digital converter according to claim 2 wherein said control means includes means for applying said clock signals to said second switch of each of said plurality of comparator means.

11. The analog-to-digital converter according to claim 2 wherein said control means includes means for applying a first clock signal to said analog switch means, means for applying a second clock signal to said first switch of each of said plurality of sample-and-hold circuits, means for applying a third clock signal to said compensator means and means for disabling said second clock signal after disabling said first clock signal and momentarily enabling said third clock signal after said first clock signal is disabled.

12. The analog-to-digital converter according to claim 1 wherein said MOS transistor switch means includes a P-channel MOS transistor and an N-channel MOS transistor, each having a drain-source path coupled to said junction of the parallel connection of said plurality of sample-and-hold circuits for applying said analog input signal to said junction.

13. An analog-to-digital conversion method for use on an analog signal inputted into an analog-to-digital converter including an analog switch means and a plurality of comparator means, the method comprising the steps of:

switching closed said analog switch means to apply said analog signal to a parallel connection of inputs of said plurality of comparator means;

injecting an offsetting voltage into said parallel connection to compensate for an offset due to said analog switch means;

switching off said analog signal from said plurality of comparator means using a plurality of first switches between said parallel connection and each of said plurality of comparator means;

switching closed a plurality of second switches to apply a plurality of references voltages to a plurality of capacitors, each connected to a one of said plurality of comparator means, to compare said plurality of reference voltages with said analog signal; and, encoding said analog signal into a digital output signal.

14. The analog-to-digital conversion method according to claim 13 further comprising a step of applying clock signals to switch said analog switch means and said first and second switches of said plurality of comparator means.

15. The analog-to-digital conversion method according to claim 13 further comprising the steps of:
generating a first clock signal for a first predetermined period for connecting said analog signal to said parallel connection of said inputs of said plurality of comparator means; and,
generating a second clock signal for a second predetermined period longer than said first predetermined period for connecting each of said plurality of comparator means to said parallel connection and for applying said reference voltages.

16. The analog-to-digital conversion method according to claim 13 further comprising a step of generating a third clock signal for a third predetermined period following expiration of said first predetermined period for controlling a clocked inverter connected between said analog switch means and said parallel connection of said plurality of comparators.

17. The analog-to-digital conversion method according to claim 16 further comprising applying mutually opposite polarity signals, based on said third clock signal, to gates of a P-channel MOS transistor and an N-channel MOS transistor included in said clocked inverter.

18. A sub-flash AD converter for sequentially operating upper comparators and lower comparators to produce a digitally converted output signal corresponding to an analog signal, comprising:
means for operating said upper comparators in parallel to compare the analog signal with upper reference voltages, said upper reference voltages corresponding to upper bit data of said digitally converter output signal, each of said upper comparators respectively comprising an upper sample-and-hold circuit means for sampling and holding said analog signal applied for comparison to said upper comparators;
means for operating said lower comparators in parallel to compare said analog signal with lower reference voltages, said lower reference voltages corresponding to lower bit data of said digitally converted output signal, each of said lower comparators respectively comprising a lower sample-and-hold circuit means for sampling and holding said analog signal applied for comparison to said lower comparators;
a reference voltage generator means for applying said upper reference voltage to said upper sample-and-hold circuits and for variably setting said lower reference voltages to said lower sample-and-hold circuits on the basis of results of comparison at said upper comparators;
a common analog switch for collectively switching and controlling said analog signal applied to said upper sample-and-hold circuits and lower sample-and-hold circuits, said common analog switch comprising a MOS transistor; and,
a compensator means for compensating a voltage offset due to said common analog switch.

19. An AD converter according to claim 18 wherein each sample-and-hold circuit includes a capacitor and means for charging said capacitor with the input analog signal and discharging the capacitor at the reference voltage.

20. An AD converter according to claim 19 further comprising means for providing a residual charge for comparison at each comparator through said charging of said capacitor with the input analog signal and said discharging at the reference voltage.

21. The sub-flash AD converter according to claim 18 wherein:
said upper sample-and-hold circuit of each of said upper comparators comprises a series connection of a first switch and a first capacitor, said first switch being connected in series to said common analog switch; and,
said lower sample-and-hold circuit of each of said lower comparators comprises a series connection of a second switch and a second capacitor, said second switch being connected in series to said common analog switch.

22. The sub-flash AD converter according to claim 21 wherein:
each of said upper comparators comprises a third switch connected to a junction of said first switch and said first capacitor for applying one of said upper reference voltages to said first capacitor; and,
each of said lower comparators comprises a fourth switch connected to a junction of said second switch and said second capacitor for applying one of said lower reference voltages to said second capacitor.

23. The sub-flash AD converter according to claim 18 further comprising a plurality of upper and lower encoders connected with said plurality of upper and lower comparators for converting output signals thereof into said output signal, respectively.

24. The sub-flash AD converter according to claim 18 further comprising control means for applying clock signals to said common analog switch, said first switch, said second switch, said third switch and said fourth switch.

25. The sub-flash AD converter according to claim 18 wherein said compensator means comprises a plurality of MOS transistors connected in series with each other to form a clocked inverter connected between said common analog switch and a junction of a parallel connection of said upper and lower comparators.

26. An analog-to-digital converter comprising:
a plurality of analog-to-digital conversion circuits for effecting conversion of an analog signal to digital signal by using mutually separated upper bit data and lower bit data;
a common analog switch, operable in an on-state and an off-state, for collectively controlling application of the analog signal to said plurality of analog-to-digital conversion circuits;
a clocked CMOS inverter having its input and output terminals connected to the output of said common analog switch; and
means for momentarily enabling said inverter immediately after said analog switch changes from said on-state to said off-state.

27. An analog switch circuit comprising:
an analog switch including MOS transistors;
a clocked CMOS inverter having input and output terminals connected to the output of said analog switch; and means for momentarily enabling said inverter immediately after said analog switch changes from on-sate to off-state.

28. An analog switch circuit connected to an analog-to-digital converter having a plurality of sample-and-hold circuits and receiving an analog signal to produce a digital output signal corresponding to a value of the analog signal, the circuit comprising:
  a single analog switch means comprising a MOS transistor for receiving the analog signal;
  a plurality of second analog switches connected at one end to said plurality of sample-and-hold circuits and at the other end to said single analog switch means;
  control signal generation means for applying signals to said plurality of second analog switches and said single analog switch means at different timings effectuating a sampling of said analog signal; and,
  compensator means connected to said analog switch means for selectively generating a first offset voltage to nullify a second offset voltage due to said analog switch means.

29. An analog switch circuit according to claim 28 wherein
  said control signal generation means includes first clock means for enabling said single analog switch means for a first predetermined period and second clock means for enabling said plurality of second analog switches for a second predetermined period longer than said first predetermined period;
  said compensator means comprises a clocked inverter having input and output connected in a negative feedback arrangement therebetween; and,
  said control signal generation means further includes third clock means for enabling said clocked inverter for a third period following expiration of said first predetermined period.

30. The analog switch circuit according to claim 29 wherein said third predetermined period is short as compared to said first and second predetermined periods.

31. The analog switch circuit according to claim 28 wherein said compensator means comprises a series connection of a P-channel MOS transistor and an N-channel MOS transistor, each having gates receiving signals opposite in polarity to form a clocked inverter, an input and output of said clocked inverter being connected to a junction of said single analog switch and said plurality of second analog switches.

32. The analog switch circuit according to claim 28 wherein said single analog switch comprises a P-channel MOS transistor and an N-channel MOS transistor connected in parallel with each other and one of gates thereof being connected with an inverter.

33. The analog switch circuit according to claim 28 wherein said control signal generation means includes
  first clock means for generating a first clock signal for a first predetermined period and applying the first clock signal to said single analog switch means;
  second clock means for generating a second clock signal for a second predetermined period longer than said first predetermined period and applying the second clock signal to said plurality of second analog switches, the second clock signal being disabled after said first clock signal is disabled, and;
  third clock means for generating a third clock signal for a third predetermined period following expiration of said first predetermined period and applying the third clock signal to said comparator means.

34. A video signal processing apparatus for performing digital conversion and signal processing on an analog video signal, the apparatus comprising:
  a video signal generating circuit means for generating the analog video signal;
  an analog-to-digital converter means for receiving said analog video signal and producing a digital output signal corresponding to a value of said analog video signal, said analog-to-digital converter means including,
    a plurality of circuit sets each having a plurality of comparator circuits having inputs connected in parallel with each other at a junction,
    an analog switch means responsive to a control signal for applying the input analog video signal to the junction of the parallel connection of said plurality of sample-and-hold circuits,
    a plurality of encoder means respectively connected to outputs of said plurality of comparator circuits for converting output signals of said plurality of comparator circuits into said digital output signal, and
    a compensator means for compensating a voltage offset generated by said analog switch means; and
  a digital signal processing circuit means for receiving said digital output signal and performing a predetermined signal processing thereof.

35. The video signal processing apparatus according to claim 34 wherein each of said plurality of comparator circuits comprises a sample-and-hold circuit having a series connection of a second analog switch and a capacitor.

36. The video signal processing apparatus according to claim 35 wherein said compensator means comprises a series connection of a P-channel MOS transistor and an N-channel MOS transistor having gates receiving signals opposite in respective polarity to form a clocked inverter, an input and output of said clocked inverter being connected to a junction of said analog switch means and said plurality of second analog switches.

37. The video signal processing apparatus according to claim 35 wherein said analog switch comprises a P-channel MOS transistor and an N-channel MOS transistor connected in parallel with each other and one of the gates thereof being connected to an inverter.

38. The video signal processing apparatus according to claim 35 further comprising control signal generation means including first clock signal generating means for generating a first clock signal applied to said analog switch means, second clock signal generating means for generating a second clock signal applied to said plurality of second analog switches, third clock signal generating means for generating a third clock signal applied to said compensator means, means for disabling said second clock signal after disabling said first clock signal and means for momentarily enabling said third clock signal after said first clock signal is disabled.

39. The video signal processing apparatus according to claim 38 wherein said control signal generation means comprises delay means for delaying said first clock signal to provide said third clock signal.

40. The video signal processing apparatus according to claim 35 further comprising a reference voltage generator means for generating and applying predetermined reference voltages to said sample-and-hold circuits.

41. The video signal processing apparatus according to claim 40 wherein each sample-and-hold circuit of said plurality of comparator circuits comprises a second switch connected to said reference voltage generator means to receive one of said reference voltages.

42. An analog-to digital converter for receiving an analog input signal and producing a digital output signal corresponding to a value of the analog input signal, the converter comprising:
   a plurality of circuit sets each having a plurality of sample-and-hold circuits having: i) inputs connected in parallel with each other at a common junction and ii) a series connection of a second analog switch and a capacitor;
   a plurality of comparators connected to outputs of said plurality of sample-and-hold circuits;
   analog switch means for selectively applying said analog input signal to said junction, the analog switch means including a clocked inverter having inverters of mutually different polarities connected in parallel with each other;
   a plurality of encoder means, each respectively connected to a one of said plurality of circuit sets for converting output signals of said plurality of comparator means into said digital output signal; and,
   control means for applying enable signals to said analog switch and the plurality of second analog switches at different times.

43. The analog-to-digital converter according to claim 42 further comprising a plurality of MOS transistors connected in series with each other to form a clocked inverter connected between said analog switch means and said junction of the parallel connection of said plurality of sample-and-hold circuits, said clocked inverter having an input and an output connected to each other establishing negative feedback therebetween, and wherein:
   said control means includes:
      first clock means for generating a first clock signal for a first predetermined period and applying the first clock signal to said analog switch;
      second clock means for generating a second clock signal for a second predetermined period longer than said first predetermined period, and applying the second clock signal to plurality of first switches, and;
      third clock means for generating a third clock signal for a third predetermined period following expiration of said first predetermined period and applying the third clock signal to said compensator means.

44. The analog-to-digital converter according to claim 43 further comprising a reference voltage generator means for receiving part of said digital output signal outputted by at least one of said plurality of encoders and applying a plurality of reference voltages to said plurality of comparator means in accordance with said digital output signal.

45. The analog-to digital converter for receiving an analog input signal and producing a digital output signal corresponding to a value of the analog input signal, the converter comprising:
   a plurality of circuit sets each having a plurality of comparator means for comparing a reference voltage to an analog signal, each of the plurality of comparator means comprising a sample-and-hold circuit, all of the sample-and-hold circuits having: inputs connected in parallel with each other at a junction for sampling and holding said analog input signal:
   analog switch means for selectively applying said analog input signal to said junction; and,
   a plurality of encoder means, each respectively connected to a one of said plurality of circuit sets for converting output signals of said plurality of comparator means into said digital output signal; and wherein said analog switch means includes a clocked inverter having inverters of mutually different polarities connected in parallel with each other.

46. An analog switch circuit connected to an analog-to-digital converter having a plurality of sample-and-hold circuits and receiving an analog signal to produce a digital output signal corresponding to a value of the analog signal, the circuit comprising:
   analog switch means for receiving the analog signal, the single analog switch including a clocked inverter having inverters of mutually different polarities connected in parallel with each other;
   a plurality of second analog switches connected at one end to said plurality of sample-and-hold circuits and at the other end to said analog switch means; and,
   control signal generation means for applying signals to said plurality of second analog switches and said analog switch means at different timings efectuating a sampling of said analog signal.

47. The analog switch circuit according to claim 46 wherein:
   said control signal generation means includes first clock means for enabling said single analog switch means for a first predetermined period and second clock means for enabling said plurality of second analog switches for a second predetermined period longer than said first predetermined period;
   said analog switch means further comprises a plurality of transistors connected in series with each other to form a second clocked inverter connected to said clocked inverter;
   said clocked inverter having an input and output connected in a negative feedback arrangement therebetween; and,
   said control signal generation means further includes third clock means connected to said second clocked inverter for enabling said clocked inverter for a third period following expiration of said first predetermined period.

48. The analog switch circuit according to claim 46 wherein said third predetermined period is less than both said first and second predetermined periods.

* * * * *

UNITED STATES PATENT AND TRADEMARK OFFICE
CERTIFICATE OF CORRECTION

PATENT NO. : 5,247,301

DATED : September 21, 1993

INVENTOR(S) : Kouichi Yahagi, et al.

It is certified that error appears in the above-identified patent and that said Letters Patent is hereby corrected as shown below:

Claim 1, column 7, line 16, delete "compensating means" and substitute therefor --injecting an offsetting voltage at said junction to compensate--. (2nd occurrence)

Claim 46, column 14, lines 36-37, delete "efectuating" and substitute therefor --effectuating--.

Signed and Sealed this

Twenty-second Day of March, 1994

Attest:

BRUCE LEHMAN

Attesting Officer    Commissioner of Patents and Trademarks